(12) United States Patent
Lee et al.

(10) Patent No.: US 8,063,573 B2
(45) Date of Patent: Nov. 22, 2011

(54) BACKLIGHT ASSEMBLY AND A DISPLAY DEVICE HAVING THE SAME

(75) Inventors: Yun-Gun Lee, Cheonan-si (KR); Moon-Shik Kang, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 449 days.

(21) Appl. No.: 12/204,621

(22) Filed: Sep. 4, 2008

(65) Prior Publication Data
US 2009/0091267 A1 Apr. 9, 2009

(30) Foreign Application Priority Data
Oct. 5, 2007 (KR) .................. 10-2007-0100284

(51) Int. Cl.
*H05B 41/28* (2006.01)
(52) U.S. Cl. ........ 315/228; 315/250; 315/291; 315/308; 315/312; 345/102
(58) Field of Classification Search .............. 315/209 R, 315/210, 219, 220, 224, 225, 226, 250, 255, 315/276, 277, 283, 291, 307, 308; 345/102
See application file for complete search history.

(56) References Cited

U.S. PATENT DOCUMENTS

| 7,294,973 B2* | 11/2007 | Takahama et al. ............. 315/224 |
|---|---|---|
| 7,615,935 B2* | 11/2009 | Takata ........................... 315/229 |
| 2004/0135941 A1* | 7/2004 | Nam et al. .................... 349/110 |
| 2005/0128377 A1* | 6/2005 | Park et al. ..................... 349/61 |
| 2006/0001386 A1 | 1/2006 | Kim et al. |
| 2006/0227088 A1* | 10/2006 | Jeon et al. ....................... 345/87 |
| 2007/0093165 A1* | 4/2007 | Komatsu et al. ............... 445/23 |
| 2007/0146980 A1* | 6/2007 | Ahn et al. ..................... 361/681 |
| 2007/0188115 A1 | 8/2007 | Lin et al. |
| 2008/0111176 A1* | 5/2008 | Barrows et al. ............... 257/312 |

FOREIGN PATENT DOCUMENTS

| JP | 2006127994 | 5/2006 |
|---|---|---|
| JP | 2007256776 | 4/2007 |
| KR | 1020070000834 | 1/2007 |
| KR | 1020070001566 | 1/2007 |

OTHER PUBLICATIONS

European Office Action dated Jan. 27, 2009 issued in corresponding European Patent Appin. 08017349.5.

* cited by examiner

*Primary Examiner* — Douglas W Owens
*Assistant Examiner* — Thai Pham
(74) *Attorney, Agent, or Firm* — F. Chau & Associates, LLC

(57) ABSTRACT

A backlight assembly includes: a plurality of lamp units; and an inverter which includes a plurality of pattern capacitors, wherein each of the pattern capacitors is electrically connected to a respective one of the plurality of lamp units, wherein each of the pattern capacitors comprises a printed circuit board, and a conductive layer formed on one side of the printed circuit board, and at least one of the plurality of pattern capacitors has a different electric capacity than another of the pattern capacitors.

22 Claims, 10 Drawing Sheets

BACKLIGHT ASSEMBLY AND A DISPLAY DEVICE HAVING THE SAME

CROSS-REFERENCE TO RELATED APPLICATION

This application claims priority to Korean Patent Application No. 10-2007-0100284, filed on Oct. 5, 2007 in the Korean Intellectual Property Office, the disclosure of which is incorporated by reference herein in its entirety.

BACKGROUND OF THE INVENTION

1. Technical Field

The present invention relates to a backlight assembly and a display device having the same, and more particularly, to a backlight assembly having a uniform brightness and a display device having the same.

2. Discussion of the Related Art

Among a variety of display devices, a display device having a liquid crystal display (LCD) panel is one example, which exhibits improved performance as it takes up less space and is lighter in weight.

A display device with an LCD panel is employed for various kinds of display devices, for example, a monitor, a TV, a mobile phone, a personal digital assistant (PDA), and a portable multimedia player (PMP).

The LCD panel is a light receiving type of display panel and thus a display device with the LCD panel uses a backlight assembly to provide light to the rear of the LCD panel.

The backlight assembly may use various lamp units such as a cold cathode fluorescent lamp (CCFL), an external electrode fluorescent lamp (EEFL), and a hot cathode fluorescent lamp (HCFL), as a light source.

However, when the lamp unit is driven, its lamps generate heat, which increases their respective temperatures. In addition, the temperature of each of the lamps varies depending on its position.

Therefore, since the lamps have different tube currents due to their varying temperatures, the brightness of the light emitted from the lamp unit is not uniform.

Accordingly, there exists a need for a backlight assembly that is capable of generating light having a uniform brightness so that the image quality of a display device can be enhanced.

SUMMARY OF THE INVENTION

In an exemplary embodiment of the present invention, a backlight assembly, comprises: a plurality of lamp units; and an inverter which includes a plurality of pattern capacitors which are electrically connected to a respective one of the plurality of lamp units, wherein each of the pattern capacitors comprises a printed circuit board, and a conductive layer formed on one side of the printed circuit board, and at least one of the plurality of pattern capacitors has a different electric capacity than another of the pattern capacitors.

The plurality of lamp units connected to the inverter may be arranged in parallel with each other.

Another conductive layer may be formed on an opposite side of the printed circuit board so that the conductive layers correspond to each other.

An area of the conductive layer of at least one of the plurality of pattern capacitors may be different from an area of the conductive layer of another of the pattern capacitors.

An area of the conductive layers of the pattern capacitors which may be connected with the lamp units which have a higher driving temperature is smaller than an area of the conductive layers of the pattern capacitors which are connected with the lamp units which have a lower driving temperature.

One of the pattern capacitors may comprise a main capacitor which is connected with the lamp unit, and at least one sub capacitor which is disposed around the main capacitor, wherein the main capacitor comprises a pair of main conductive layers, and the sub capacitor comprises a pair of sub conductive layers.

The main capacitor included in each of the plurality of pattern capacitors may have substantially the same area, and the sub capacitor included in each of the plurality of pattern capacitors is selectively connected and disconnected with the main capacitor.

A number of the sub capacitors which may be connected with the main capacitors of the pattern capacitors which are connected with the lamp units which have a higher driving temperature is smaller than a number of the sub capacitors which is connected with the main capacitors of the pattern capacitors which are connected with the lamp units which have a lower driving temperature.

The pattern capacitors which may be connected with the lamp units which have a higher driving temperature have a smaller electric capacity than the pattern capacitors which are connected with the lamp units which have a lower driving temperature, and substantially the same tube current flows through the plurality of lamp units.

The plurality of lamp units may be cold cathode fluorescent lamps.

In an exemplary embodiment of the present invention, a display device, comprises: a display panel which displays an image; a plurality of lamp units which supply light to the display panel; and an inverter which includes a plurality of pattern capacitors, wherein each of the pattern capacitors is electrically connected to a respective one of the plurality of lamp units, wherein each of the pattern capacitors comprises a printed circuit board, and a conductive layer formed on one side of the printed circuit board, and at least one of the plurality of pattern capacitors has a different electric capacity than another of the pattern capacitors.

The plurality of lamp units connected to the inverter may be arranged in parallel with each other.

Another conductive layer may be formed on an opposite side of the printed circuit board so that the conductive layers correspond to each other.

An area of the conductive layer of at least one of the plurality of pattern capacitors may be different from an area of the conductive layer of another of the pattern capacitors.

The display device may further comprise a data driving unit which is connected to a side of the display panel, wherein the plurality of lamp units are disposed on a rear surface of the display panel, and an area of the conductive layers of the pattern capacitors which are connected with the lamp units which are positioned adjacent to the data driving unit is smaller than an area of the conductive layers of the pattern capacitors which are connected with the lamp units which are positioned away from the data driving unit.

One of the pattern capacitors may comprise a main capacitor which is connected with the lamp unit, and at least one sub capacitor which is disposed around the main capacitor, wherein the main capacitor comprises a pair of main conductive layers, and the sub capacitor comprises a pair of sub conductive layers.

The main capacitor included in each of the plurality of pattern capacitors may have substantially the same area, and the sub capacitor included in each of the plurality of pattern capacitors is selectively connected and disconnected with the main capacitor.

The display device may further comprise a data driving unit which is connected to a side of the display panel, wherein the plurality of lamp units are disposed on a rear surface of the display panel, and a number of the sub capacitors which are connected with the main capacitors of the pattern capacitors which are connected with the lamp units which are positioned adjacent to the data driving unit is smaller than a number of the sub capacitors which are connected with the main capacitors of the pattern capacitors which are connected with the lamp units which are positioned away from the data driving unit.

The display device may further comprise a data driving unit which is connected to a side of the display panel, wherein the plurality of lamp units are disposed on a rear surface of the display panel, wherein the pattern capacitors which are connected with the lamp units which are positioned adjacent to the data driving unit have a smaller electric capacity than the pattern capacitors which are connected with the lamp units which are positioned away from the data driving unit, and substantially the same tube current flows through the plurality of lamp units.

The plurality of lamp units may be cold cathode fluorescent lamps.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF EXEMPLARY EMBODIMENTS

Exemplary embodiments of the invention are described more fully hereinafter with reference to the accompanying drawings. This invention may, however, be embodied in many different forms and should not be construed as limited to the embodiments set forth herein.

In the accompanying drawings, thickness is enlarged to clearly illustrate various layers and areas. That a first part such as a layer, an area, a substrate, etc. is provided "over" or "on" a second part may mean that the first part is provided directly on the second part, or that a third part is provided therebetween.

Figure 1:
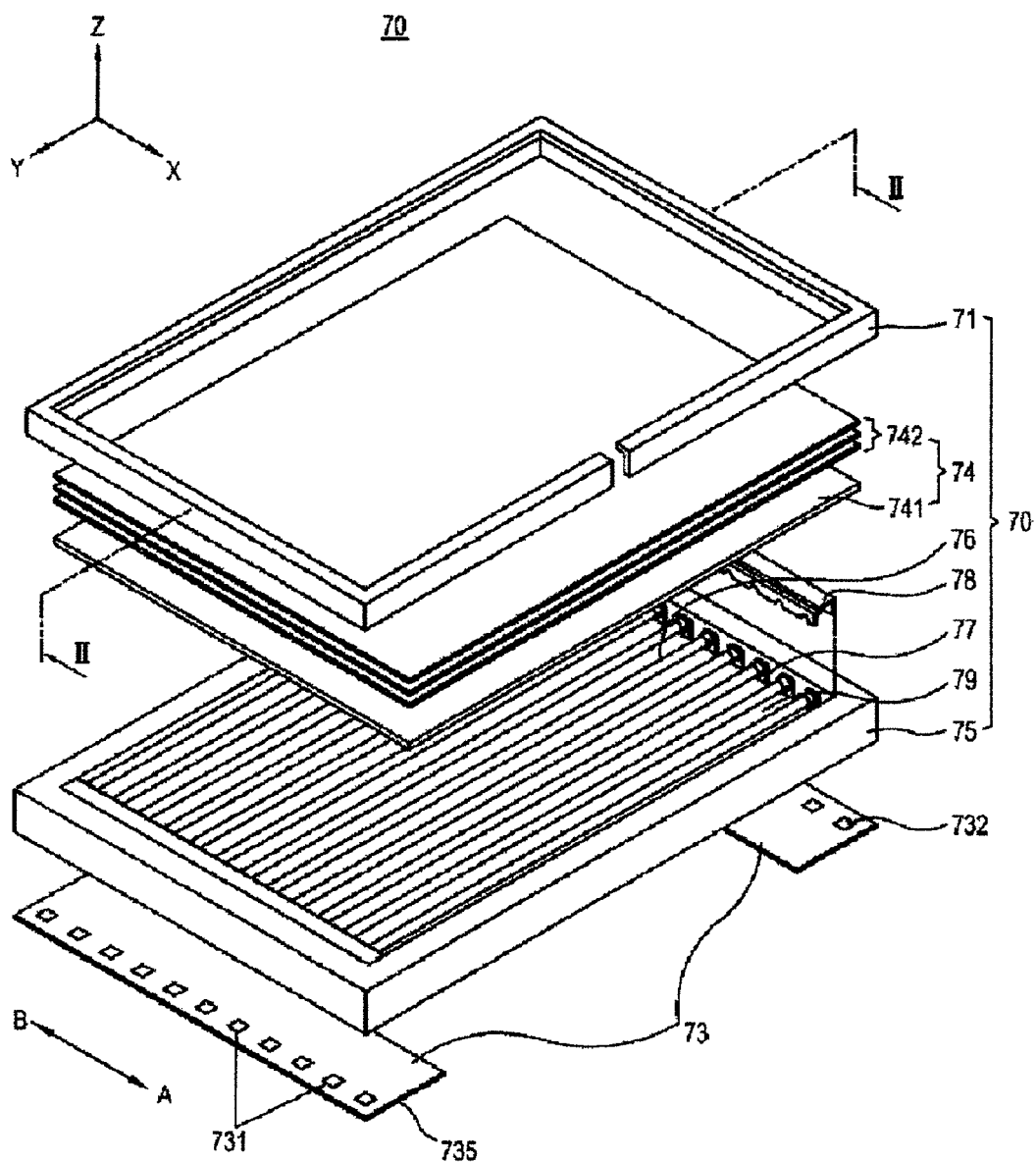
FIG. 1 is an exploded perspective view of a backlight assembly according to an exemplary embodiment of the present invention.

Hereinafter, an exemplary embodiment of the present invention will be described by referring to FIGS. 1 and 2. FIG. 1 is an exploded perspective view of a backlight assembly 70, and FIG. 2 illustrates a cross-sectional view of the backlight assembly 70 taken along line II-II shown in FIG. 1.

Figure 2:
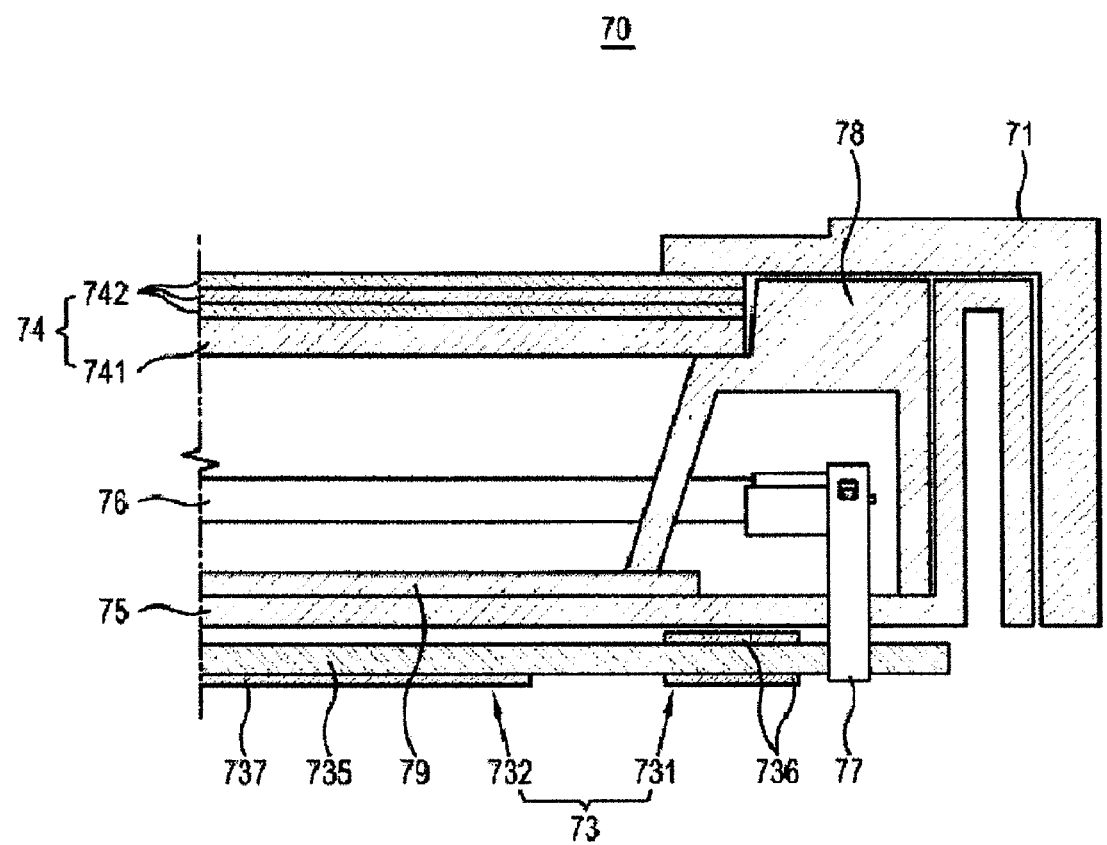
FIG. 2 is a cross-sectional view of the backlight assembly taken along line II-II in FIG. 1.

As shown in FIGS. 1 and 2, the backlight assembly 70 includes a lamp unit 76 and an inverter 73. The backlight assembly 70 further includes a lamp socket 77, an optical member 74, a reflecting member 79, a lamp cover 78, a supporting member 71 and an accommodating member 75.

The lamp unit 76 is provided in plural to emit light. The lamp unit 76 may be a cold cathode fluorescent lamp (CCFL), an external electrode fluorescent lamp (EEFL), a hot cathode fluorescent lamp (HCFL), etc. In the present exemplary embodiment, the lamp unit 76 employs the cold cathode fluorescent lamp, but the lamp unit 76 is not limited thereto. The lamp unit 76 includes a lamp part for emitting light, and an electrode part positioned at opposite end parts of the lamp part.

The lamp unit 76 generates light and heat when it is driven. Accordingly, the lamp unit 76 has a high temperature for a period of time after it stops operating. In addition, the lamp unit 76 has different temperatures depending on its position.

In general, the backlight assembly 70 is mounted to a display device, which is used in a standing state. Since the lamp unit 76 generates heat when it is driven, and the heat generated by the lamp units 76 positioned in a lower part of the backlight assembly 70 is transferred to the lamp units 76 positioned in an upper part of the backlight assembly 70, the lamp units 76 positioned in the upper part have a high temperature. In the present exemplary embodiment, the lamp units 76 positioned in a direction A in FIG. 1 are positioned in the upper part, and the lamp units 76 positioned in a direction B in FIG. 1 are positioned in the lower part. A tube current flowing through the lamp unit 76 is influenced by temperature. In other words, a higher tube current flows through the lamp units 76 positioned in the direction A, since they have a relatively high temperature compared to the lamp units 76 positioned in the direction B which have a relatively low temperature. As the tube current flowing through the lamp unit 76 increases, the brightness of the light which the lamp unit 76 generates increases. Accordingly, if the same voltage and current are supplied to the opposite electrode parts of the lamp units 76, the brightness of each lamp unit 76 is not uniform due to a temperature variation between the lamp units 76.

The inverter 73 transforms an external power to a uniform voltage level, and then applies this to the lamp unit 76, thereby driving the lamp unit 76. The inverter 73 includes a printed circuit board (PCB) 735, and various circuit layers 736 and 737 formed on the printed circuit board 735. The inverter 73 also includes a plurality of pattern capacitors 731 electrically connected with a plurality of lamp units 76, respectively. The pattern capacitor 731 includes the printed circuit board 735, and a pair of conductive layers 736 formed on opposite sides of the printed circuit board 735 to face each other. In other words, the conductive layers 736 are formed to have the printed circuit board 735 interposed therebetween. Here, the printed circuit board 735 becomes a dielectric part of the pattern capacitor 731, and the conductive layer 736 becomes an electrode of the pattern capacitor 731.

At least one pattern capacitor 731 of the plurality of pattern capacitors 731 has a larger or smaller electric capacity than other pattern capacitors 731. In other words, all the pattern capacitors 731 may have different electric capacities, or some of the pattern capacitors 731 may have substantially the same electric capacities. However, all the pattern capacitors 731 do not have the same electric capacity. In detail, the pattern capacitor 731 connected with the lamp unit 76 positioned in the direction A has a smaller electric capacity than the pattern capacitor 731 connected with the lamp unit 76 positioned in the direction B.

Like this, since a large tube current flows through the lamp unit 76 positioned in the direction A because of its high temperature, the lamp unit 76 is connected with the pattern capacitor 731 having a relatively small electric capacity so that the tube current flowing through the lamp unit 76 can decrease. On the other hand, since a small tube current flows through the lamp unit 76 positioned in the direction B because of its low temperature, the lamp unit 76 is connected with the pattern capacitor 731 having a relatively large electric capacity so that the tube current flowing through the lamp unit 76 can increase. Accordingly, substantially the same tube current can flow through all of the plurality of lamp units 76. Here, since the tube current is substantially the same, the brightness of the light emitted from each lamp unit 76 has such a small variation that a user cannot distinguish a brightness difference. In other words, the plurality of lamp units 76 have a substantially uniform brightness.

In the present exemplary embodiment, since the temperature of the lamp units 76 positioned in the upper part is high, and the tube current thereof is large, the brightness thereof is large. However, the present invention is not limited thereto. In other words, since the temperature of the lamp units 76 are influenced by a heat radiating configuration, the temperature of a lamp unit 76 positioned in a central part of the backlight assembly 70 may be the highest. The electric capacity of the pattern capacitor 731 is determined with consideration to a brightness difference among the lamp units 76. In addition, since the temperature of the lamp unit 76 may vary depending on whether it is used in a standing state or lying state, the electric capacity of the pattern capacitor 731 may be adjusted depending on its intended use. The lamp socket 77 supports the opposite end parts of the lamp unit 76, and is connected with the electrode part. The lamp socket 77 electrically connects the lamp unit 76 and the inverter 73. In other words, the pattern capacitor 731 of the inverter 73 is connected with the lamp unit 76 through the lamp socket 77. The lamp socket 77 is coupled with the accommodating member 75 to be supported. As shown in FIG. 2, the lamp socket 77 is directly connected with the inverter 73, but the present invention is not limited thereto. Alternatively, the lamp socket 77 may be electrically connected with the inverter 73 through a wire or a cable.

The lamp cover 78 covers the opposite end parts of the lamp unit 76. In other words, the lamp cover 78 covers and protects the electrode part of the lamp unit 76 and the lamp socket 77. In addition, the lamp cover 78 reflects a portion of the light generated by the lamp unit 76 to improve light efficiency. In addition, the lamp cover 78 may support an edge of the optical member 74.

The optical member 74 includes a diffusing plate 741 for diffusing the light emitted from the lamp unit 76, and an optical sheet assembly 742 for improving a brightness property of the light transmitted through the diffusing plate 741.

The optical sheet assembly 742 may include sheets having various functions such as a diffusing sheet, a prism sheet, a brightness increasing sheet, a protecting sheet, etc.

The accommodating member 75 accommodates the lamp unit 76, the lamp socket 77, the lamp cover 78, the reflecting member 79, the supporting member 71 and the optical member 74. In addition, the inverter 73 is disposed on a rear surface of the accommodating member 75.

The reflecting member 79 is disposed on a bottom surface of the accommodating member 75 to which the lamp unit 76 is accommodated and reflects again a part of the light which is reflected by the optical member 74. In other words, the reflecting member 79 reflects all light emitted from the lamp unit 76 in a forward direction to reduce the loss of light, and helps diffuse the light, thereby improving uniformity of the light which the backlight assembly 70 supplies.

The supporting member 71 is coupled with the accommodating member 75 to support the optical member 74. In addition, the supporting member 71 supports a circumference of a display panel 50 shown in FIG. 8 disposed on the backlight assembly 70. As shown in FIG. 1, the supporting member 71 is formed in an open shape. However, the present invention is not limited thereto, and alternatively, the supporting member 71 may be formed in a closed shape.

In addition, as shown in FIG. 1, both the accommodating member 75 and the supporting member 71 are used. However, the present invention is not limited thereto. Alternatively, the supporting member 71 may be omitted.

With this configuration, the backlight assembly 70 can generate light having uniform brightness.

Figure 3:
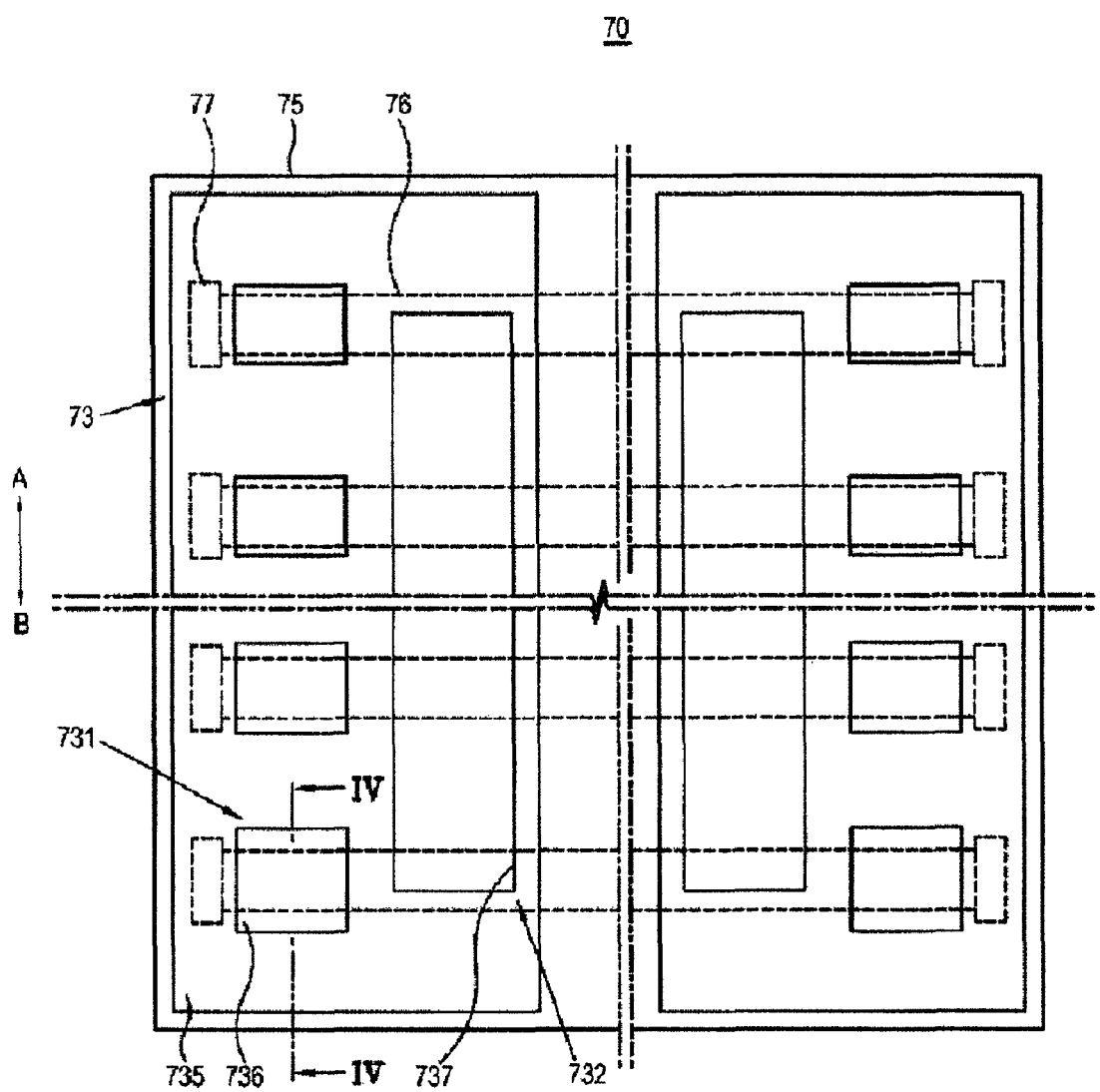
FIG. 3 is a plane view of an inverter disposed on a rear surface of an accommodating member of the backlight assembly in FIG. 1.
Figure 4:
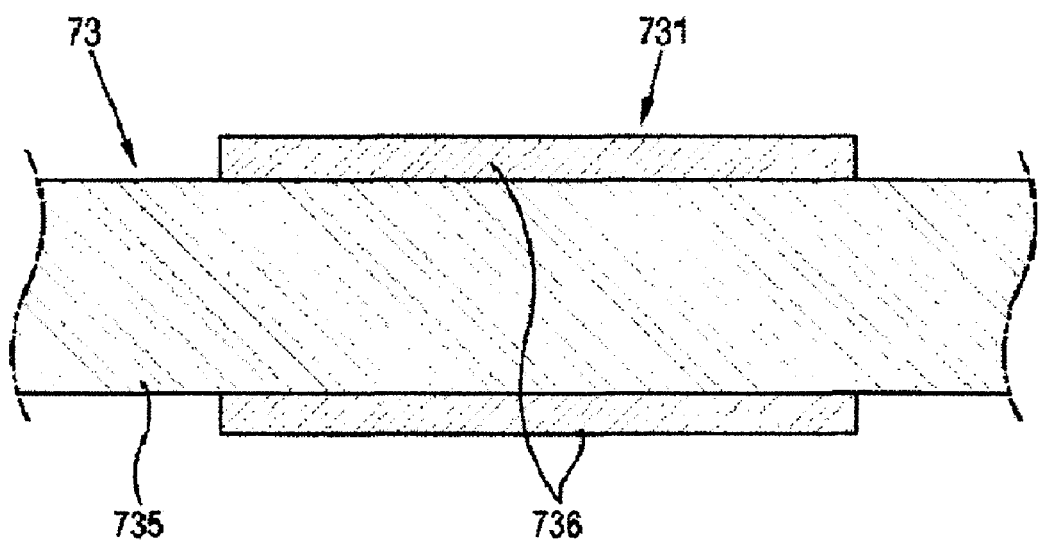
FIG. 4 is a cross-sectional view of a pattern capacitor of the inverter taken along line IV-IV in FIG. 3.

Hereinafter, the inverter 73 will be described in detail by referring to FIGS. 3 and 4. FIG. 3 is a plane view of the inverter 73 disposed on the rear surface of the accommodating member 75. In other words, FIG. 3 illustrates a portion of a rear plane view of the backlight assembly 70. In FIG. 3, a dashed line refers to the lamp unit 76 and the lamp socket 77. FIG. 4 illustrates a cross-section of the pattern capacitor 731 of the inverter 73 taken along line IV-IV in FIG. 3.

As shown in FIG. 3, a pair of inverters 73 are electrically connected to the opposite end parts of the lamp unit 76, respectively. Here, the inverter 73 and the lamp unit 76 are connected through the lamp socket 77. The inverter 73 includes the pattern capacitor 731 and a circuit unit 732. Here, the circuit unit 732 includes a driving circuit, a power supplying circuit, etc. Although not shown in FIG. 3, the inverter 73 further includes a wire connecting the pattern capacitor 731, the circuit unit 732, etc.

The pattern capacitor 731, the circuit unit 732, the wire (not shown), etc. are formed on the printed circuit board 735. In detail, as shown in FIG. 4, the pattern capacitor 731 includes the printed circuit board 735, and a pair of conductive layers 736 formed on opposite sides of the printed circuit board 735 to face each other. Here, the pair of conductive layers 736 corresponding to each other has substantially the same area. In other words, the printed circuit board 735 becomes a dielectric part of the pattern capacitor 731, and the pair of conductive layers 736 becomes an electrode of the pattern capacitor 731.

Alternatively, the conductive layer 736 may be formed only on a single surface of the printed circuit board 735.

The pattern capacitor 731 is connected to each end part of the lamp unit 76 one by one. In other words, the inverter 73 includes a plurality of pattern capacitors 731 having various electric capacities. A plurality of lamp units 76 are connected to the inverter 73 in parallel.

The conductive layer 736 of at least one pattern capacitor 731 of the plurality of pattern capacitors 731 has a different area from those of the conductive layers 736 of other pattern capacitors 731. In other words, the conductive layers 736 of all the pattern capacitors 731 may have different areas except the pair of conductive layers 736 corresponding to each other, or the conductive layers 736 of some of the pattern capacitors 731 may have substantially the same area. However, the conductive layers 736 of all the pattern capacitors 731 do not have the same area.

Like this, since the pattern capacitors 731 have conductive layers 736 with different areas, the inverter 73 can have a plurality of pattern capacitors 731 having various electric capacities. The electric capacity of the pattern capacitor 731 is proportional to the area of the pair of conductive layers 736.

The area of the pair of conductive layers 736 of the pattern capacitor 731 connected with the lamp unit 76 positioned in the direction A having the relatively high driving temperature is smaller than the area of the pair of conductive layers 736 of the pattern capacitor 731 connected with the lamp unit 76 positioned in the direction B having the relatively low driving temperature.

With this configuration, the backlight assembly 70 can generate light having a uniform brightness. This is so, because the tube current flowing through the lamp unit 76 having the relatively high driving temperature and the lamp unit 76 having the relatively low driving temperature can be substantially maintained at an equal level.

Figure 5:
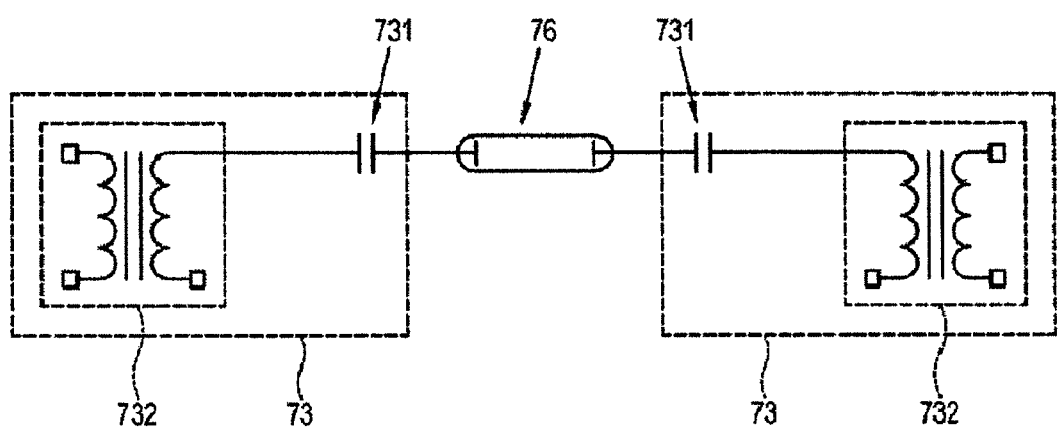
FIG. 5 is a circuit diagram of a lamp unit connected with an inverter of the backlight assembly in FIG. 1.

FIG. 5 is a circuit diagram illustrating the inverter 73 connected with a single lamp unit 76. As shown in FIG. 5, a power supplying circuit provided to the circuit unit 732 includes a transformer. Power supplied from the power supplying circuit is supplied to the end part of the lamp unit 76 through the pattern capacitor 731 under control of the driving circuit.

Figure 6:
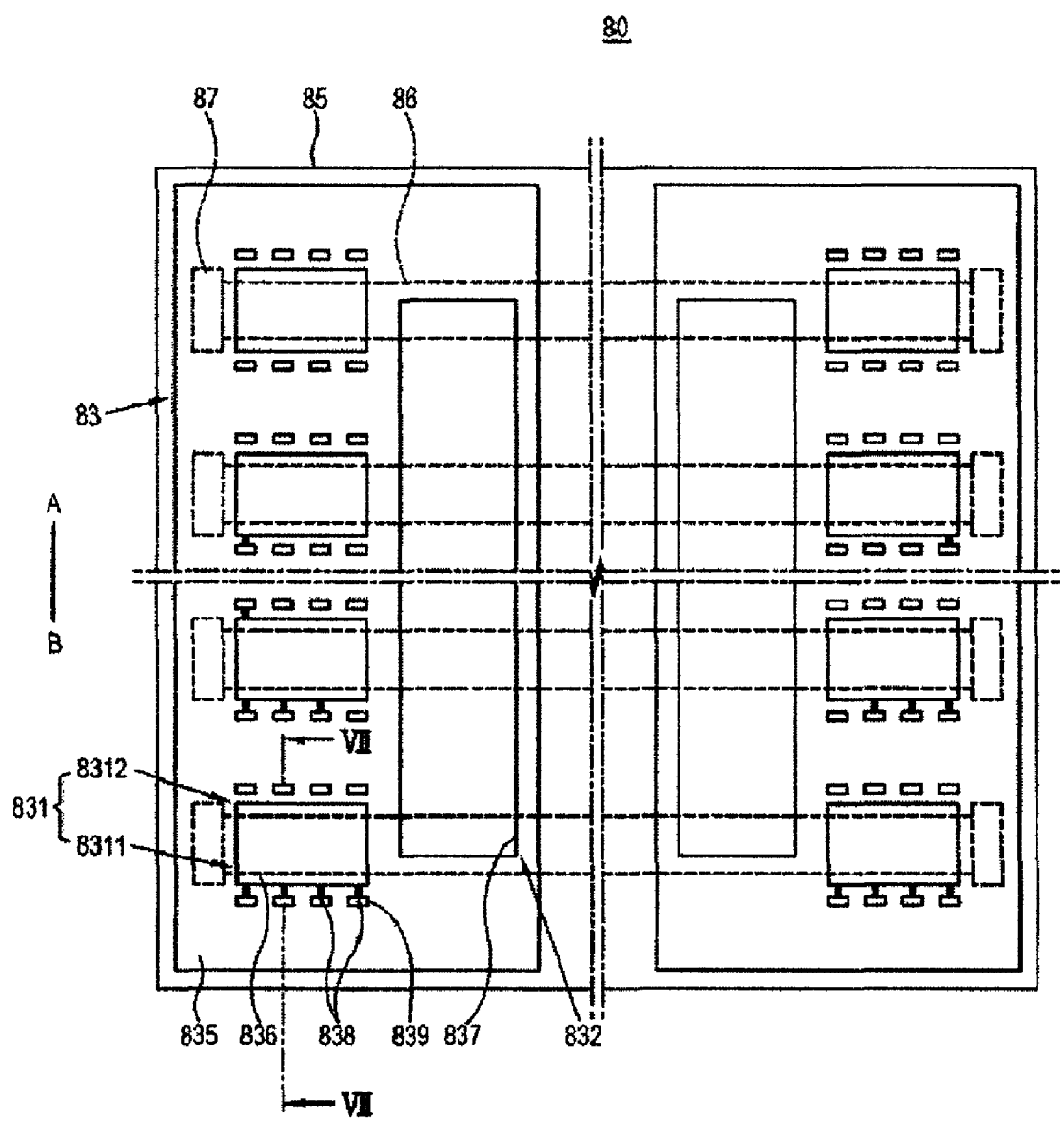
FIG. 6 is a plane view of an inverter disposed on a rear surface of an accommodating member of a backlight assembly according to an exemplary embodiment of the present invention.
Figure 7:
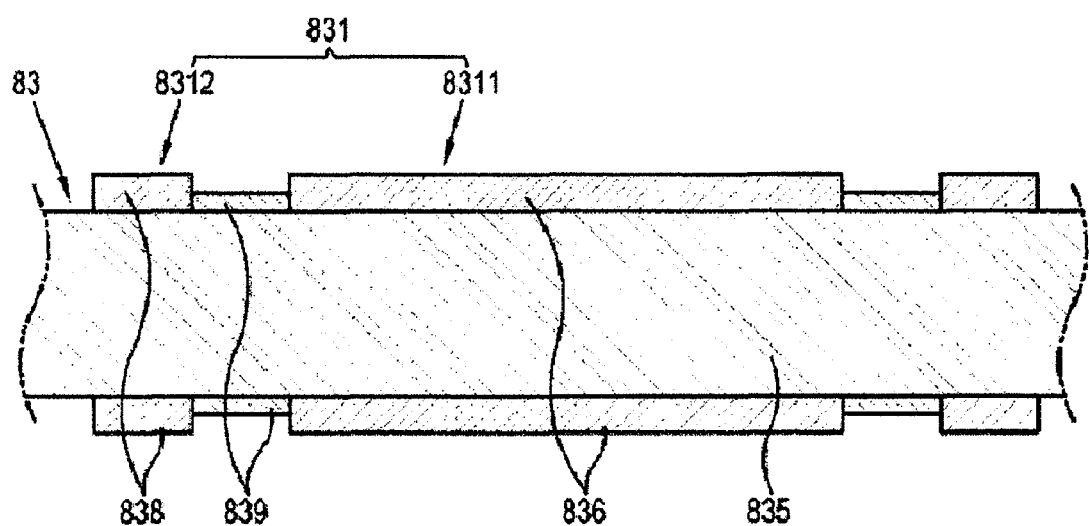
FIG. 7 is a cross-sectional view of a pattern capacitor of the inverter taken along line VII-VII in FIG. 6.

Hereinafter, an exemplary embodiment of the present invention will be described by referring to FIGS. 6 and 7. FIG. 6 is a plane view of an inverter 83 disposed on a rear surface of an accommodating member 85. In FIG. 6, a dashed line refers to a lamp unit 86 and a lamp socket 87. FIG. 7 illustrates a cross-section of a pattern capacitor 831 of the inverter 83 taken along line VII-VII in FIG. 6.

As shown in FIG. 6, the single pattern capacitor 831 includes a main capacitor 8311 connected with the lamp unit 86, and at least one sub capacitor 8312 disposed around the main capacitor 8311. Here, at least one sub capacitor 8312 may be selectively connected and disconnected with the main capacitor 8311. In FIG. 6, eight sub capacitors 8312 are disposed around the single main capacitor 8311. The main capacitor 8311 and the sub capacitor 8312 may be connected and disconnected by means of a known method, such as a laser, a wire, soldering, etc.

The single main capacitor 8311 includes a pair of main conductive layers 836 corresponding to each other with a printed circuit board 835 interposed therebetween, and each sub capacitor 8312 includes a pair of sub conductive layers 838 corresponding to each other with the printed circuit board 835 interposed therebetween. Here, the corresponding main conductive layers 836 and the corresponding sub conductive layers 838 have substantially the same areas, respectively. In addition, the main capacitors 8311 of a plurality of the pattern capacitors 831 have substantially the same electric capacity. In other words, the areas of the main conductive layers 836 of the main capacitors 8311 are substantially the same. Accordingly, a total electric capacity of the pattern capacitor 831 is determined according to the number of the sub capacitors 8312 connected with the main capacitor 8311.

The number of sub capacitors 8312 connected with the main capacitor 8311 is smaller in the pattern capacitor 831 connected with the lamp unit 86 positioned in a direction A having a relatively high driving temperature than in the pattern capacitor 831 connected with the lamp unit 86 positioned in a direction B having a relatively low driving temperature.

Like this, the number of the sub capacitors 8312 connected with the main capacitor 8311 is changed to adjust the electric capacity of the pattern capacitor 831 connected to each lamp unit 86.

With this configuration, a backlight assembly 80 can generate light having a uniform brightness. This is so, because a tube current flowing through the lamp unit 86 having the relatively high driving temperature and the lamp unit 86 having the relatively low driving temperature can be substantially maintained at an equal level.

In addition, the electric capacity of the pattern capacitor 831 connected to each lamp unit 86 may be adjusted to correspond to a temperature distribution of the plurality of lamp units 86 which varies depending on how the backlight assembly 80 is used. Accordingly, the backlight assembly 80 can uniformly generate light in different operating environments.

In addition, as the number of the sub capacitors 8312 disposed around the main capacitor 8311 increases, the brightness of the lamp unit 86 can become more uniform and more precisely adjusted.

Hereinafter, a display device 100 according to an exemplary embodiment of the present invention will be described by referring to FIGS. 8 and 9. The display device 100 shown in FIGS. 8 and 9 includes a backlight assembly 70 as shown in FIGS. 1 to 5.

Figure 8:
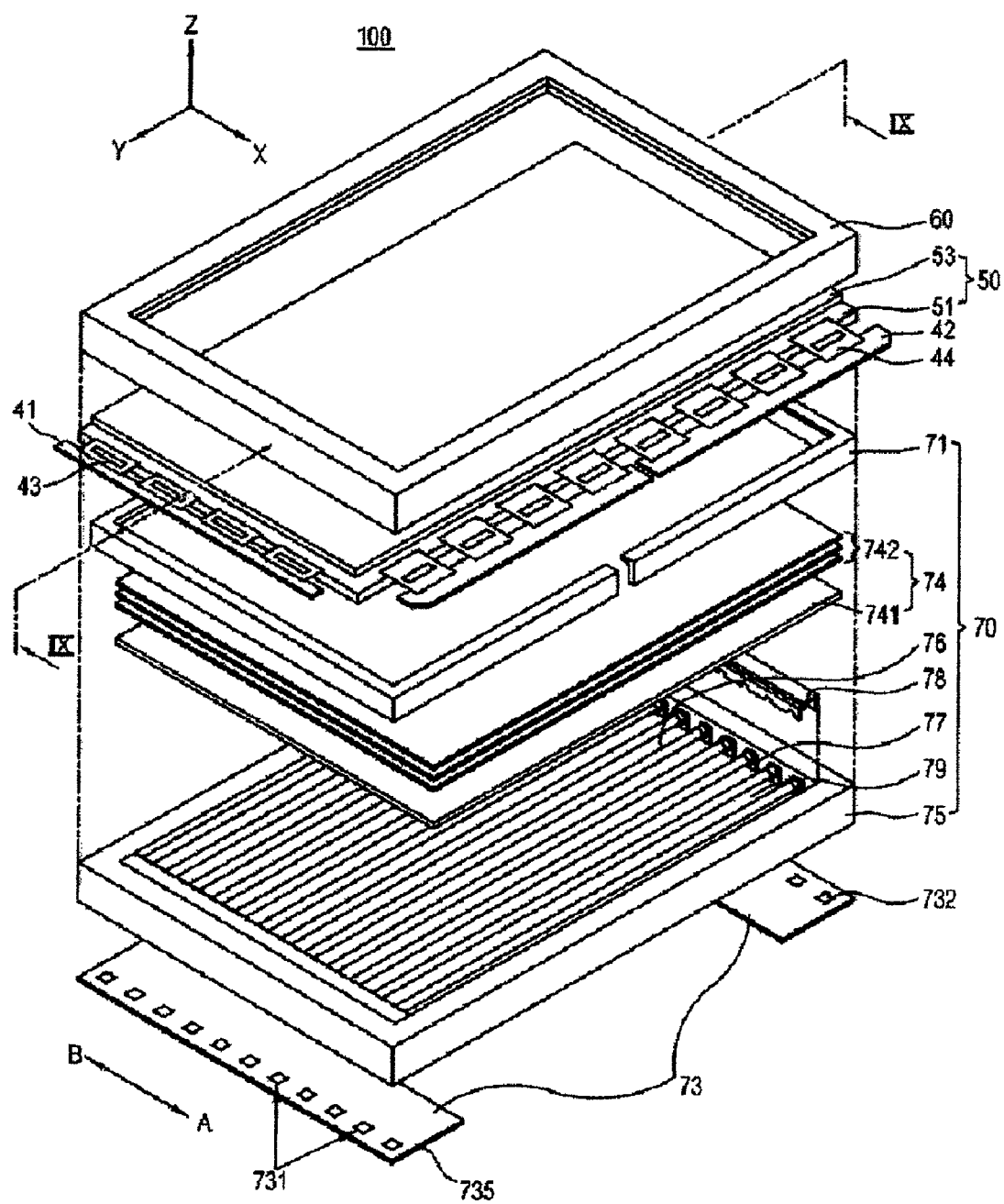
FIG. 8 is an exploded perspective view of a display device according to an exemplary embodiment of the present invention.
Figure 9:
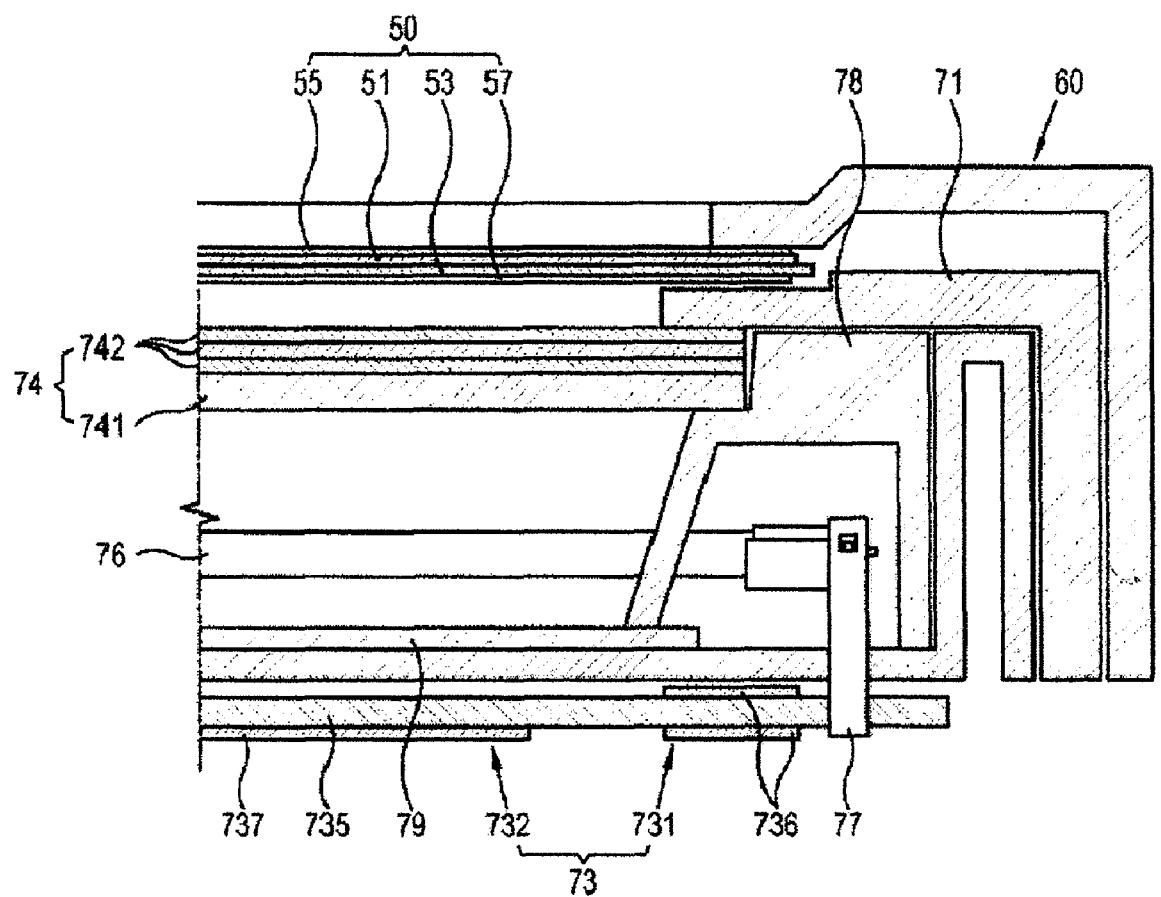
FIG. 9 is a cross-sectional view of the display device taken along line IX-IX in FIG. 8.

As shown in FIGS. 8 and 9, a liquid crystal display panel is exemplarily illustrated as a display panel 50 used by the display device 100, but the present invention is not limited thereto. Alternatively, a light receiving display panel of other types may be used.

The display device 100 includes the backlight assembly 70 for supplying light, and the display panel 50 for receiving the light to display an image. The display panel 50 is supported by a supporting member 71 of the backlight assembly 70. The display device 100 further includes a cover member 60 to couple the display panel 50 to the backlight assembly 70, and may further include other necessary elements.

In addition, the display device 100 includes a plurality of driving integrated circuit chip packages 43 and 44 and driving printed circuit boards 41 and 42 electrically connected with the display panel 50 to transmit a driving signal. Here, the driving integrated circuit chip packages 43 and 44 are a chip on film package (COF), or a tape carrier package (TCP).

The driving integrated circuit chip packages 43 and 44 include gate driving integrated circuit chip packages 43, and data driving integrated circuit chip packages 44. The gate driving integrated circuit chip packages 43 are attached to a first edge of the display panel 50 to supply a gate signal to the display panel 50. The data driving integrated circuit chip packages 44 are attached to a second edge of the display panel 50 adjacent to the first edge to supply other signals including a data signal to the display panel 50.

In other words, the gate driving integrated circuit chip packages 43 become a gate driving unit, and the data driving integrated circuit chip packages 44 become a data driving unit. However, the gate driving unit and the data driving unit are not limited to the illustrated gate driving integrated circuit chip packages 43 and data driving integrated circuit chip packages 44.

A plurality of light source units 76 is disposed in rows on a rear surface of the display panel 50. The plurality of light source units 76 may be divided into a first outer portion, which includes light source units 76 adjacent to the data driving unit, a second outer portion, which includes light source units 76 away from the data driving unit, and a central portion, which includes light source units 76 between both outer portions.

Here, the light source units 76 positioned in a direction A having a relatively high driving temperature are included in the first outer portion, and the light source units 76 positioned in a direction B having a relatively low driving temperature are included in the second outer portion.

The display panel 50 includes a first display plate 51, and a second display plate 53 facing the first display plate 51 with a liquid crystal layer (not shown) interposed therebetween. Here, the first display plate 51 becomes a rear substrate, and the second display plate 53 becomes a front substrate. The second display plate 53 is smaller than the first display plate 51. Here, first sides of the driving integrated circuit chip packages 43 and 44 are attached to an edge of the first display plate 51 not overlapped by the second display plate 53 to be connected with the display panel 50. In addition, a second side of at least one of the driving integrated circuit chip package 43 and 44 is connected with the driving printed circuit boards 41 and 42.

As shown in FIG. 8, all the driving integrated circuit chip packages 43 and 44 are connected with the driving printed circuit boards 41 and 42, but the present invention is not limited thereto. Alternatively, the driving printed circuit board 41 connected with the gate driving integrated circuit chip package 43 may be omitted. Here, a first side of the gate driving integrated circuit chip package 43 is connected with the display panel 50, and a second side thereof is connected with nothing.

In addition, the display device 100 further includes polarizing plates 57 and 55 shown in FIG. 9 respectively attached to a front surface of the second display plate 53 and a rear surface of the first display plate 51. The polarizing plates 55 and 57 linearly polarize a visible ray supplied from the backlight assembly 70.

The first display plate 51 and the second display plate 53 are formed with a plurality of thin film transistors (TFT), color filters, pixel electrodes, common electrodes, etc. In addition, the liquid crystal layer is disposed between the pixel electrode and the common electrode.

With this configuration, if the thin film transistor which is a switching element is turned on, an electric field is formed between the pixel electrode and the common electrode. An arrangement of liquid crystal molecules in the liquid crystal layer is varied by the electric field. Thus, by regulating the strength of the electric field, which varies the transmittance of light passing through the liquid crystal layer, the display panel 50 obtains a desired image.

The backlight assembly 70 shown in FIGS. 8 and 9 may have the configuration of the backlight assembly 70 described above with reference to FIGS. 1 to 5.

With this configuration, the display device 100 can receive light having a uniform brightness to stably maintain the quality of an image.

Hereinafter, a display device 200 according to an exemplary embodiment of the present invention will be described by referring to FIG. 10. The display device 200 shown in FIG. 10 includes a backlight assembly 80 as shown in FIGS. 6 and 7.

Figure 10:
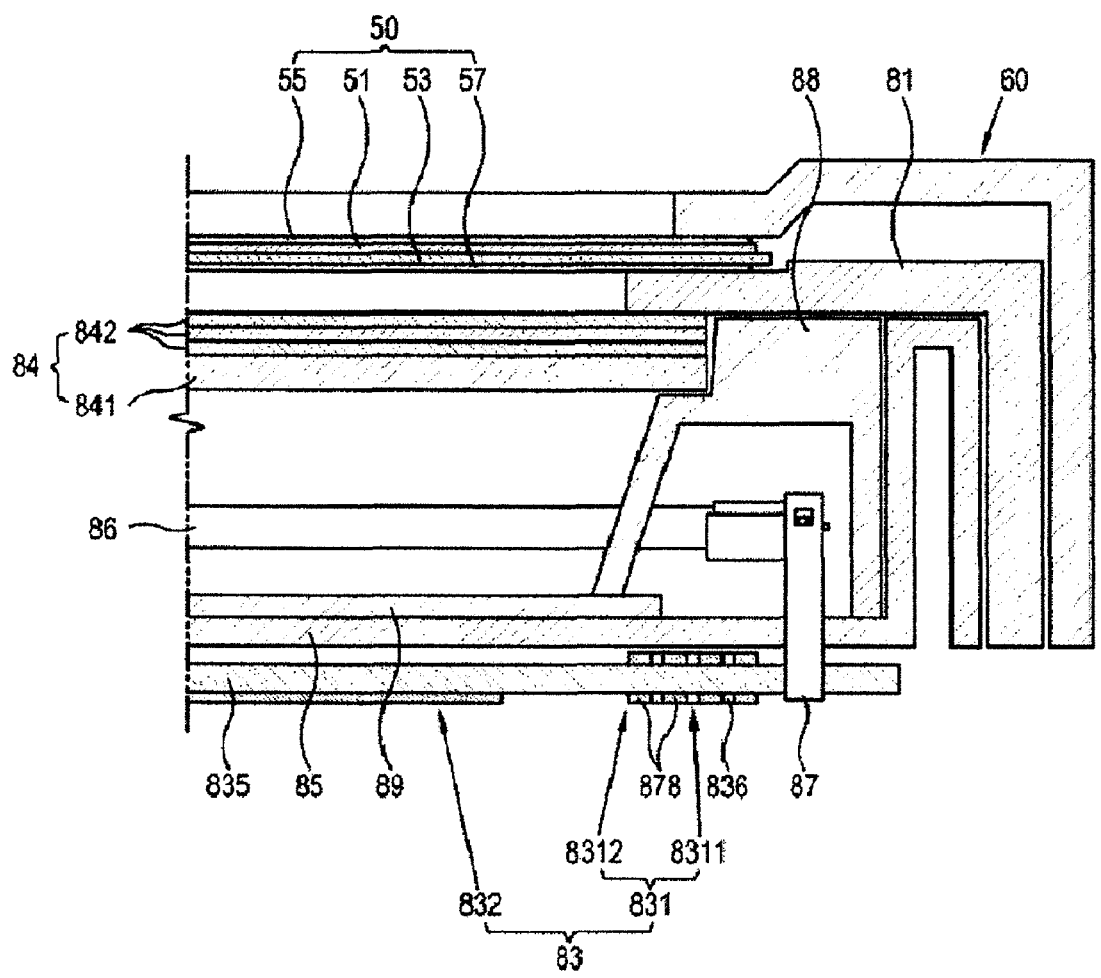
FIG. 10 is a cross-sectional view of a display device according to an exemplary embodiment of the present invention.

As shown in FIG. 10, the display device 200 includes the backlight assembly 80 for supplying light, and a display panel 50 for receiving the light to display an image. Here, the display panel 50 is supported by a supporting member 81 of the backlight assembly 80. The display device 200 further includes a cover member 60 to couple the display panel 50 to the backlight assembly 80, and may further include other necessary elements.

The backlight assembly 80 may have the configuration of the backlight assembly 80 described above with reference to FIGS. 6 and 7. In other words, an inverter 83 includes a pattern capacitor 831 including a main capacitor 8311 and a sub capacitor 8312. The number of the sub capacitors 8312 connected with the main capacitor 8312 is changed to adjust an electric capacity of the pattern capacitor 831 connected to each lamp unit 86.

With this configuration, the display device 200 can receive light having a uniform brightness to stably maintain the quality of an image.

In addition, the electric capacity of the pattern capacitor 831 connected to each lamp unit 86 can be adjusted to correspond to a temperature distribution of a plurality of lamp units 86 which may vary depending on how the display device 200 is used. Accordingly, the display device 200 can receive light having a uniform brightness to stably maintain the quality of an image in different operating environments.

In addition, as the number of the sub capacitors 8312 disposed around the main capacitor 8311 increases, the brightness of the lamp unit 86 can become more uniform and more precisely adjusted.

As described above, a backlight assembly according to an exemplary embodiment of the present invention can generate light having a uniform brightness. This is so, because a tube current flowing in a lamp unit having a relatively high driving temperature, and a tube current flowing in a lamp unit having a relatively low driving temperature can be substantially maintained at an equal level.

In addition, the number of sub capacitors connected with a main capacitor is changed to adjust an electric capacity of a pattern capacitor connected to each lamp unit. Accordingly, the electric capacity of the pattern capacitor connected to each lamp unit can be adjusted to correspond to a temperature distribution of a plurality of lamp units which may vary depending on how the backlight assembly is used. Accordingly, the backlight assembly can uniformly generate light in different operating environments.

In addition, a display device according to an exemplary embodiment of the present invention includes the above described backlight assembly. Accordingly, the display device can stably maintain the quality of an image.

While the present invention has been described in detail with reference to the exemplary embodiments, those skilled in the art will appreciate that various modifications and substitutions can be made thereto without departing from the spirit and scope of the present invention as set forth in the appended claims.

What is claimed is:

1. A backlight assembly, comprising:
a plurality of lamp units disposed inside an accommodating member; and
an inverter which includes a plurality of pattern capacitors, wherein each of the pattern capacitors is electrically connected to a respective one of the plurality of lamp units,
wherein each of the pattern capacitors comprises a printed circuit board, and a conductive layer formed on one side of the printed circuit board, and
at least one of the plurality of pattern capacitors has a different electric capacity than another of the pattern capacitors, and
wherein one of the pattern capacitors includes a main capacitor and at least one sub capacitor and the inverter is disposed outside the accommodating member to permit the sub capacitor to be connected to and disconnected from the main capacitor after the backlight assembly has been completely assembled to adjust a brightness of the lamp unit to which the pattern capacitor is connected.

2. The backlight assembly according to claim 1, wherein the plurality of lamp units connected to the inverter are arranged in parallel with each other.

3. The backlight assembly according to claim 1, wherein another conductive layer is formed on an opposite side of the printed circuit board so that the conductive layers correspond to each other.

4. The backlight assembly according to claim 1, wherein an area of the conductive layer of at least one of the plurality of pattern capacitors is different from an area of the conductive layer of another of the pattern capacitors.

5. The backlight assembly according to claim 4, wherein an area of the conductive layers of the pattern capacitors which are connected with the lamp units which have a higher driving temperature is smaller than an area of the conductive layers of the pattern capacitors which are connected with the lamp units which have a lower driving temperature.

6. The backlight assembly according to claim 1, wherein the main capacitor comprises a pair of main conductive layers, and
the sub capacitor comprises a pair of sub conductive layers.

7. The backlight assembly according to claim 6, wherein the main capacitor included in each of the plurality of pattern capacitors has substantially the same area, and
the sub capacitor included in each of the plurality of pattern capacitors is selectively connected and disconnected with the main capacitor.

8. The backlight assembly according to claim 7, wherein a number of the sub capacitors which are connected with the main capacitors of the pattern capacitors which are connected with the lamp units which have a higher driving temperature is smaller than a number of the sub capacitors which are connected with the main capacitors of the pattern capacitors which are connected with the lamp units which have a lower driving temperature.

9. The backlight assembly according to claim 4, wherein the pattern capacitors which are connected with the lamp units which have a higher driving temperature have a smaller electric capacity than the pattern capacitors which are connected with the lamp units which have a lower driving temperature, and
substantially the same tube current flows through the plurality of lamp units.

10. The backlight assembly according to claim 1, wherein the plurality of lamp units are cold cathode fluorescent lamps.

11. A display device, comprising:
a display panel which displays an image;
a plurality of lamp units which supply light to the display panel, wherein the plurality of lamp units are disposed inside an accommodating member; and
an inverter which includes a plurality of pattern capacitors, wherein each of the pattern capacitors is electrically connected to a respective one of the plurality of lamp units,
wherein each of the pattern capacitors comprises a printed circuit board, and a conductive layer formed on one side of the printed circuit board, and
at least one of the plurality of pattern capacitors has a different electric capacity than another of the pattern capacitors, and
wherein one of the pattern capacitors includes a main capacitor and at least one sub capacitor and the inverter is disposed outside the accommodating member to permit the sub capacitor to be connected to and disconnected from the main capacitor after a backlight assembly including the lamp units and the inverter has been completely assembled to adjust a brightness of the lamp unit to which the pattern capacitor is connected.

12. The display device according to claim 11, wherein the plurality of lamp units connected to the inverter are arranged in parallel with each other.

13. The display device according to claim 11, wherein another conductive layer is formed on an opposite side of the printed circuit board so that the conductive layers correspond to each other.

14. The display device according to claim 11, wherein an area of the conductive layer of at least one of the plurality of pattern capacitors is different from an area of the conductive layer of another of the pattern capacitors.

15. The display device according to claim 14, further comprising a data driving unit which is connected to a side of the display panel,
wherein the plurality of lamp units are disposed on a rear surface of the display panel, and
an area of the conductive layers of the pattern capacitors which are connected with the lamp units which are positioned adjacent to the data driving unit is smaller than an area of the conductive layers of the pattern capacitors which are connected with the lamp units which are positioned away from the data driving unit.

16. The display device according to claim 11, wherein the main capacitor comprises a pair of main conductive layers, and
the sub capacitor comprises a pair of sub conductive layers.

17. The display device according to claim 16, wherein the main capacitor included in each of the plurality of pattern capacitors has substantially the same area, and
the sub capacitor included in each of the plurality of pattern capacitors is selectively connected and disconnected with the main capacitor.

18. The display device according to claim 17, further comprising a data driving unit which is connected to a side of the display panel,
wherein the plurality of lamp units are disposed on a rear surface of the display panel, and
a number of the sub capacitors which are connected with the main capacitors of the pattern capacitors which are connected with the lamp units which are positioned adjacent to the data driving unit is smaller than a number of the sub capacitors which are connected with the main capacitors of the pattern capacitors which are connected with the lamp units which are positioned away from the data driving unit.

19. The display device according to claim 14, further comprising a data driving unit which is connected to a side of the display panel,
wherein the plurality of lamp units are disposed on a rear surface of the display panel,
wherein the pattern capacitors which are connected with the lamp units which are positioned adjacent to the data driving unit have a smaller electric capacity than the pattern capacitors which are connected with the lamp units which are positioned away from the data driving unit, and
substantially the same tube current flows through the plurality of lamp units.

20. The display device according to claim 11, wherein the plurality of lamp units are cold cathode fluorescent lamps.

21. A backlight assembly, comprising:
a plurality of lamp units; and
an inverter which includes a plurality of pattern capacitors, wherein each of the pattern capacitors is electrically connected to a respective one of the plurality of lamp units,
wherein each of the pattern capacitors comprises a printed circuit board, and a conductive layer formed on one side of the printed circuit board, and
at least one of the plurality of pattern capacitors has a different electric capacity than another of the pattern capacitors, and
wherein the inverter further includes a power supplying circuit disposed on the printed circuit board, and
wherein one of the pattern capacitors includes a main capacitor and at least one sub capacitor and the inverter is disposed outside an accommodating member to permit the sub capacitor to be connected to and disconnected from the main capacitor after the backlight assembly has been completely assembled to adjust a brightness of the lamp unit to which the pattern capacitor is connected.

22. The backlight assembly according to claim 7, wherein the sub capacitors are selectively connected and disconnected with the main capacitor after the plurality of lamps are encased inside the accommodating member.

* * * * *